United States Patent
Park et al.

(10) Patent No.: US 7,990,305 B2
(45) Date of Patent: Aug. 2, 2011

(54) CURRENT MODE DOUBLE-INTEGRATION CONVERSION APPARATUS

(75) Inventors: Ji Man Park, Daejeon (KR); Young Soo Park, Daejeon (KR); Sung Ik Jun, Daejeon (KR); Jong Soo Jang, Daejeon (KR); Sung Won Sohn, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 51 days.

(21) Appl. No.: 12/514,066

(22) PCT Filed: Nov. 13, 2007

(86) PCT No.: PCT/KR2007/005685
§ 371 (c)(1),
(2), (4) Date: May 7, 2009

(87) PCT Pub. No.: WO2008/069466
PCT Pub. Date: Jun. 12, 2008

(65) Prior Publication Data
US 2010/0066582 A1 Mar. 18, 2010

(30) Foreign Application Priority Data
Dec. 8, 2006 (KR) .................. 10-2006-0124609
Jun. 4, 2007 (KR) .................. 10-2007-0054698

(51) Int. Cl.
*H03M 1/82* (2006.01)

(52) U.S. Cl. ...................... 341/167; 341/155

(58) Field of Classification Search .............. 341/167, 341/168, 155, 156, 159, 150, 172, 158, 161, 341/164, 131, 123; 327/77
See application file for complete search history.

(56) References Cited

U.S. PATENT DOCUMENTS

| | | |
|---|---|---|
| 5,103,230 A | 4/1992 | Kalthoff et al. |
| 5,321,403 A | 6/1994 | Eng, Jr. et al. |
| 5,367,302 A | 11/1994 | Kalthoff et al. |
| 5,457,714 A * | 10/1995 | Engel et al. .................... 375/247 |
| 5,652,586 A | 7/1997 | Chuh et al. |
| 5,805,097 A | 9/1998 | Yung |
| 6,157,672 A | 12/2000 | Iwata et al. |
| 2008/0309386 A1 * | 12/2008 | Vlasenko ...................... 327/157 |

FOREIGN PATENT DOCUMENTS
JP 10-222598 8/1998
KR 10-1995-0022157 A 7/1995

* cited by examiner

*Primary Examiner* — Joseph Lauture
(74) *Attorney, Agent, or Firm* — Blakely, Sokoloff, Taylor & Zafman

(57) ABSTRACT

A double-integration signal processing apparatus for pulse width amplification and A/D conversion is provided. The current mode double-integration conversion apparatus includes: a current mode double-integration unit which integrates an input current in a predetermined time interval and outputs an integration voltage; a comparison unit which compares the integration voltage output from the current mode double-integration unit with a predetermined comparison voltage V k and outputs an comparison pulse signal; and a gate logic unit which performs a logic operation by using the comparison pulse signal of the comparison unit and an internal signal and outputs an logic operation pulse signal. Accordingly, the current mode double-integration conversion apparatus can be applied to various sensors.

17 Claims, 18 Drawing Sheets

[Fig. 1]
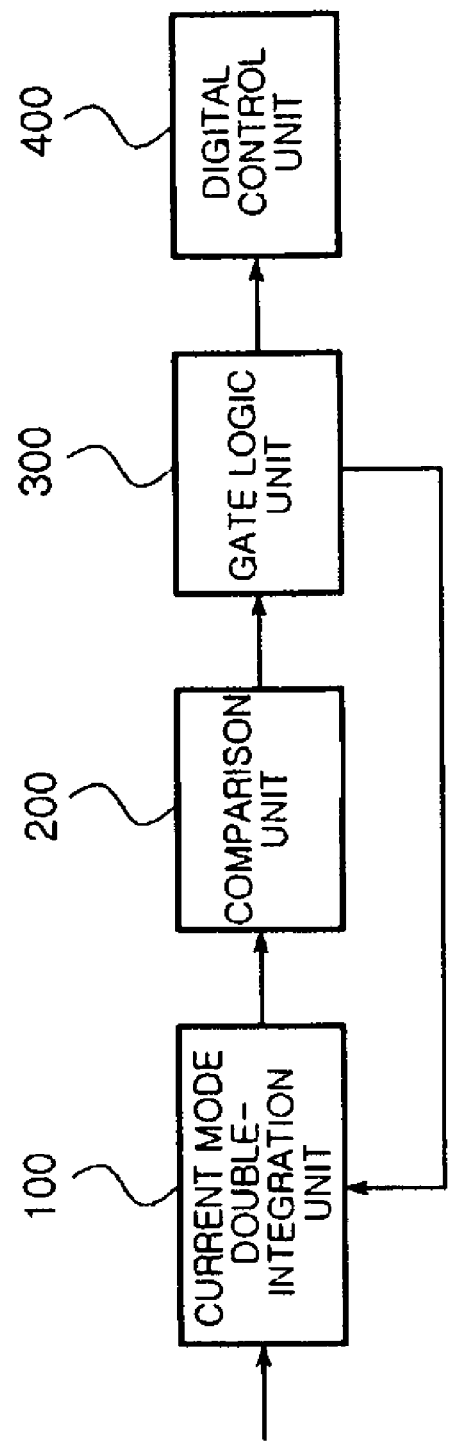

[Fig. 2]
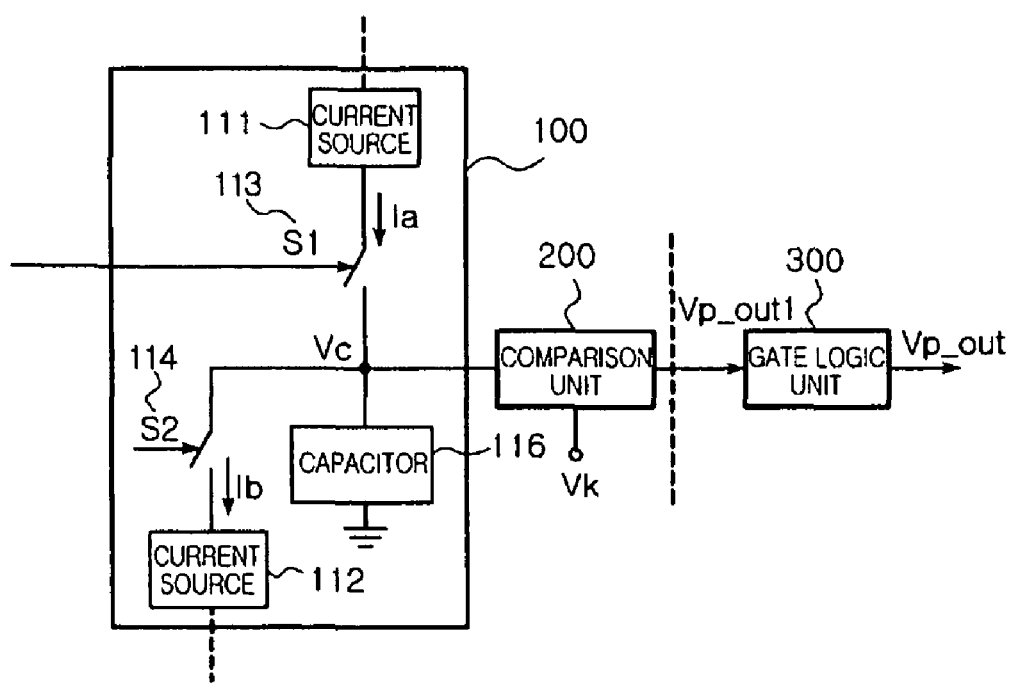

[Fig. 3]
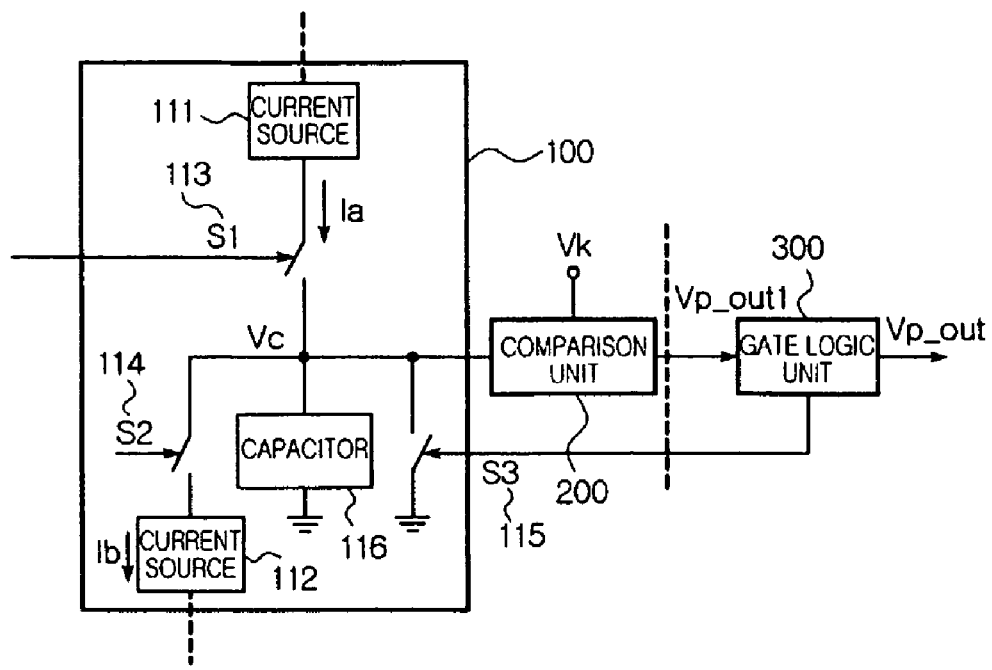

[Fig. 4]
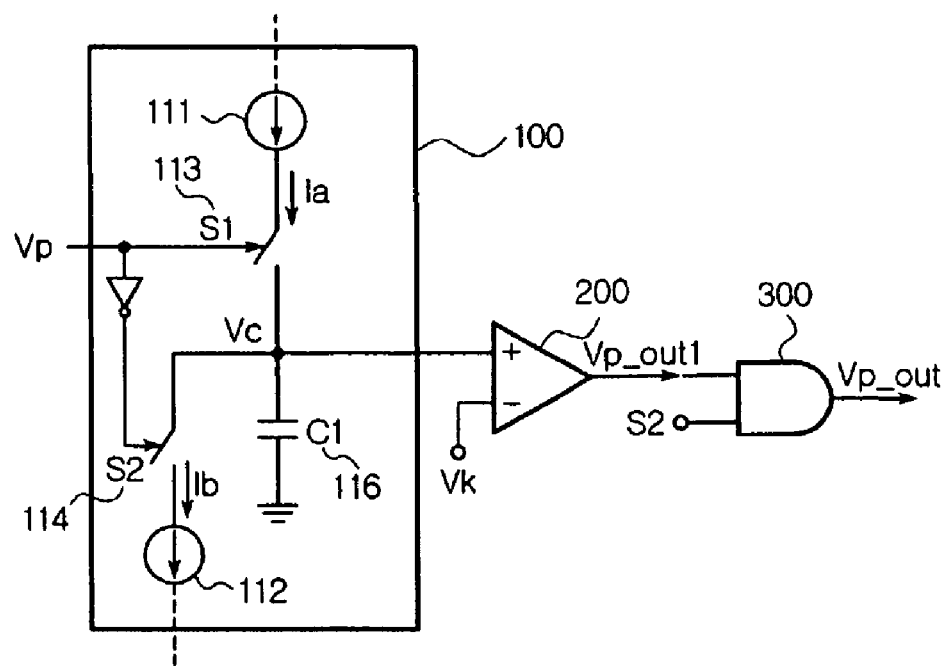

[Fig. 5]
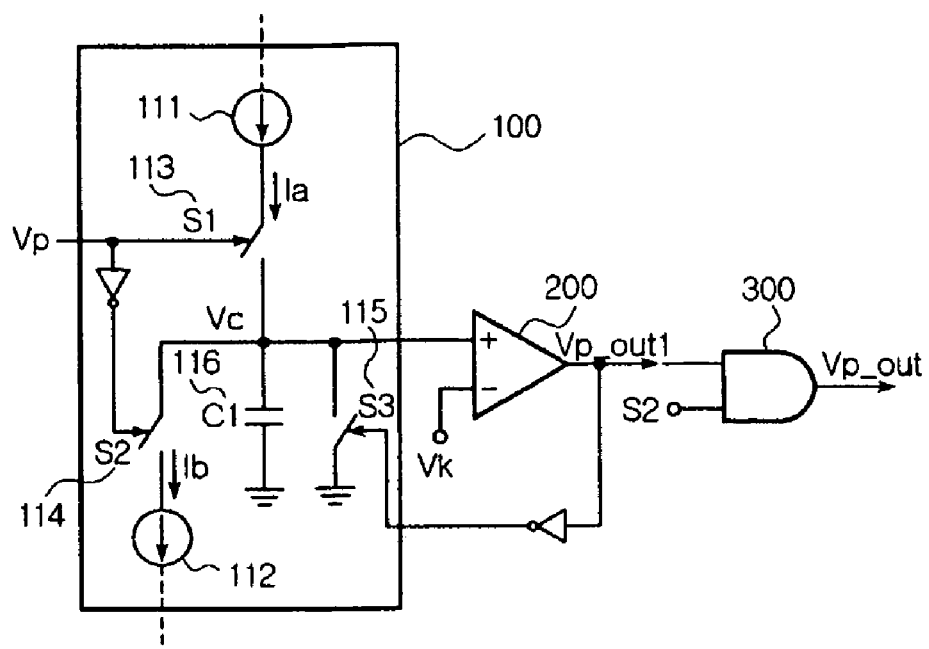

[Fig. 6]
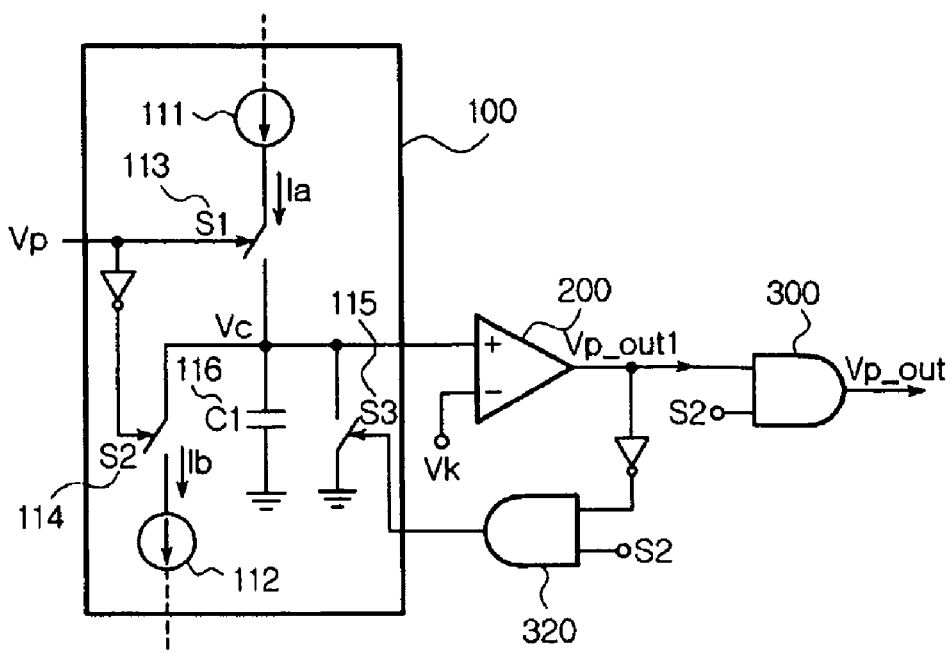

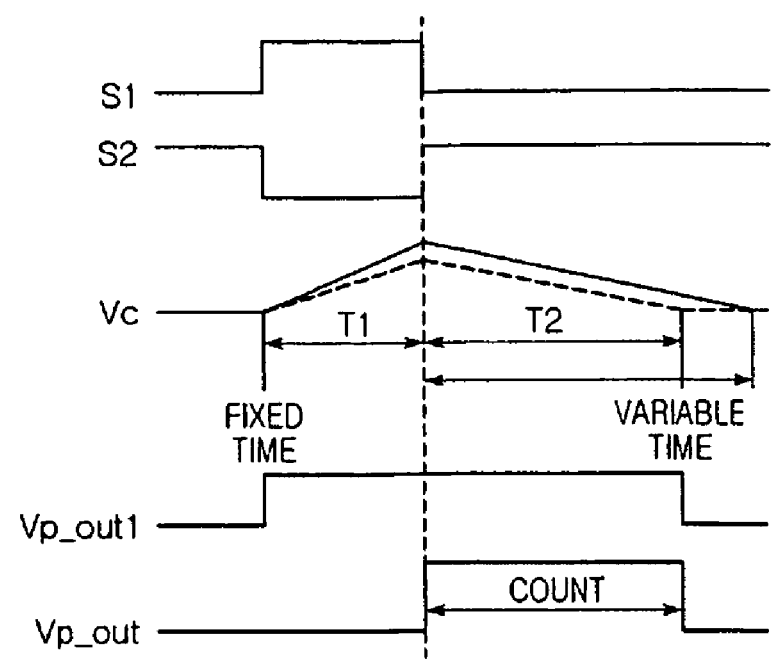
[Fig. 7]

[Fig. 8]
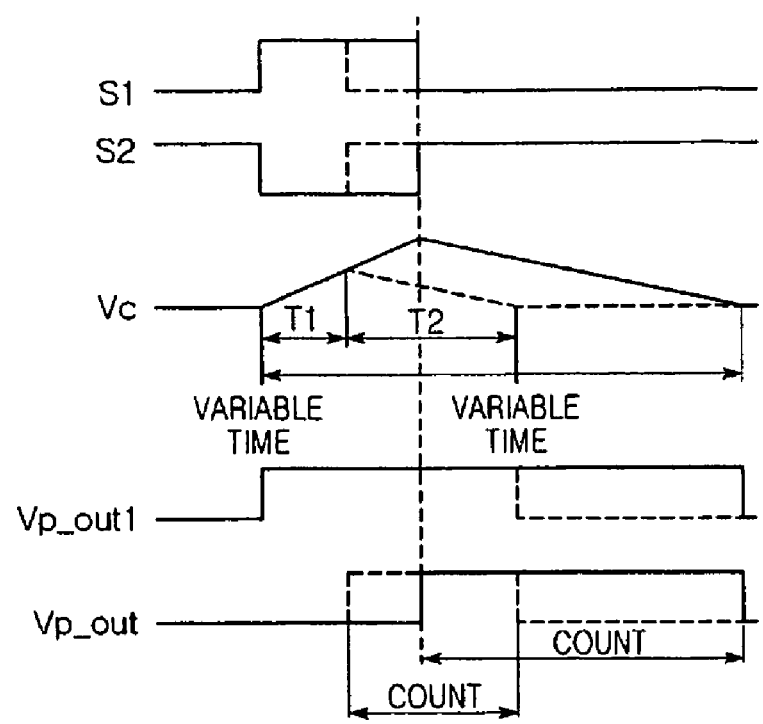

[Fig. 9]
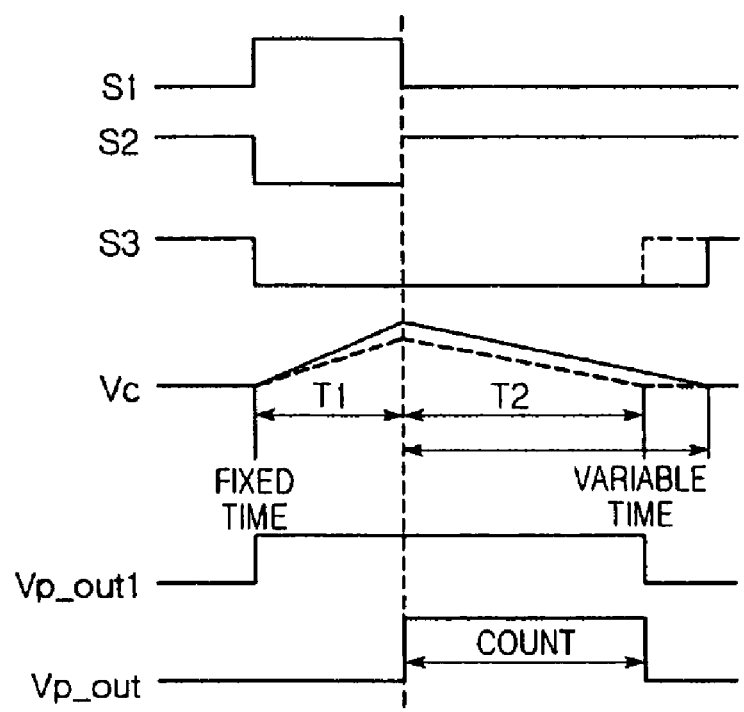

[Fig. 10]
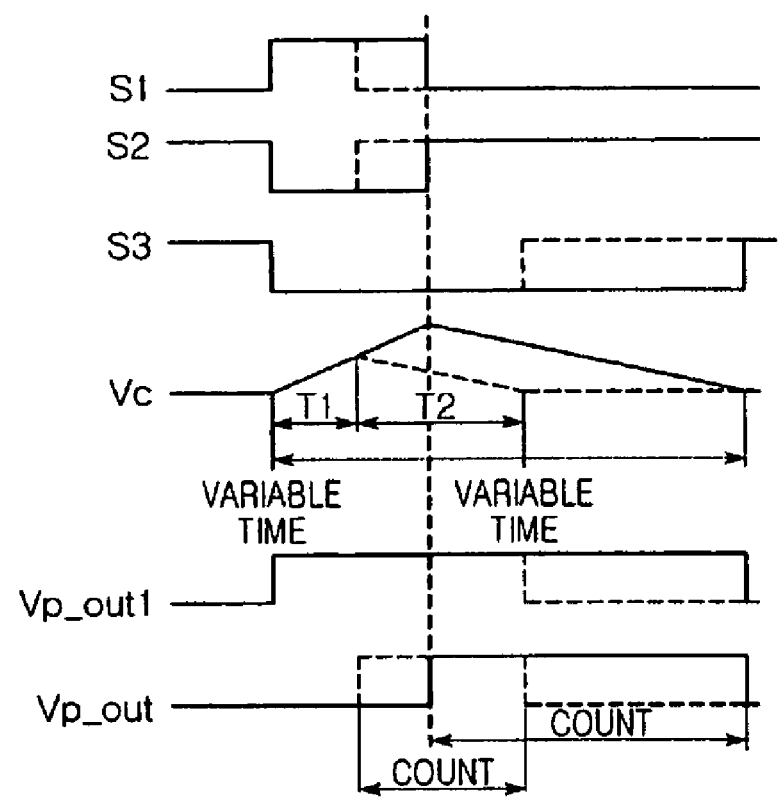

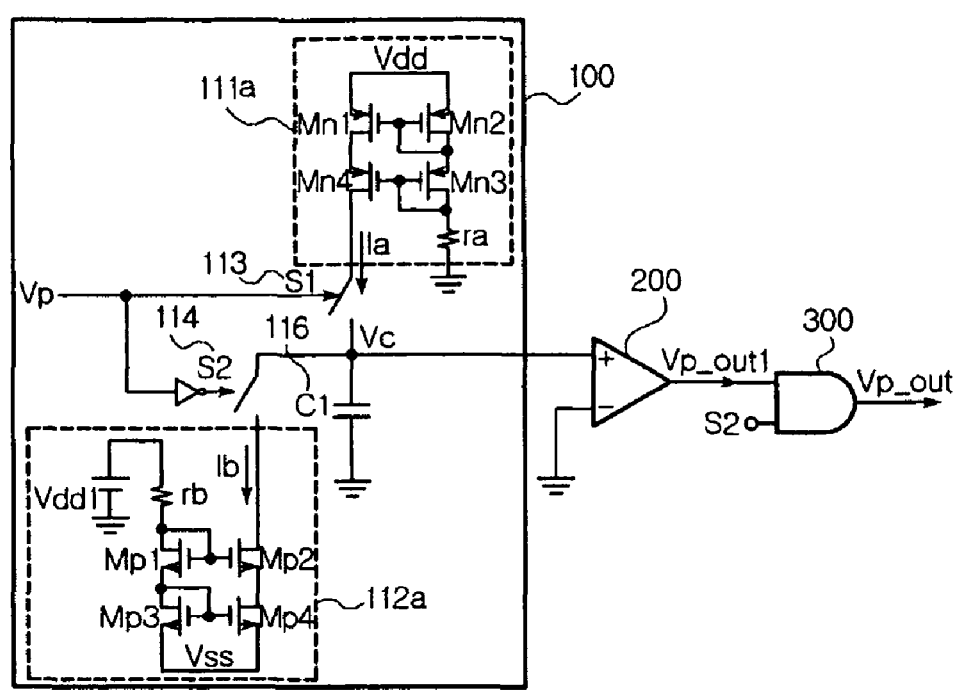
[Fig. 11]

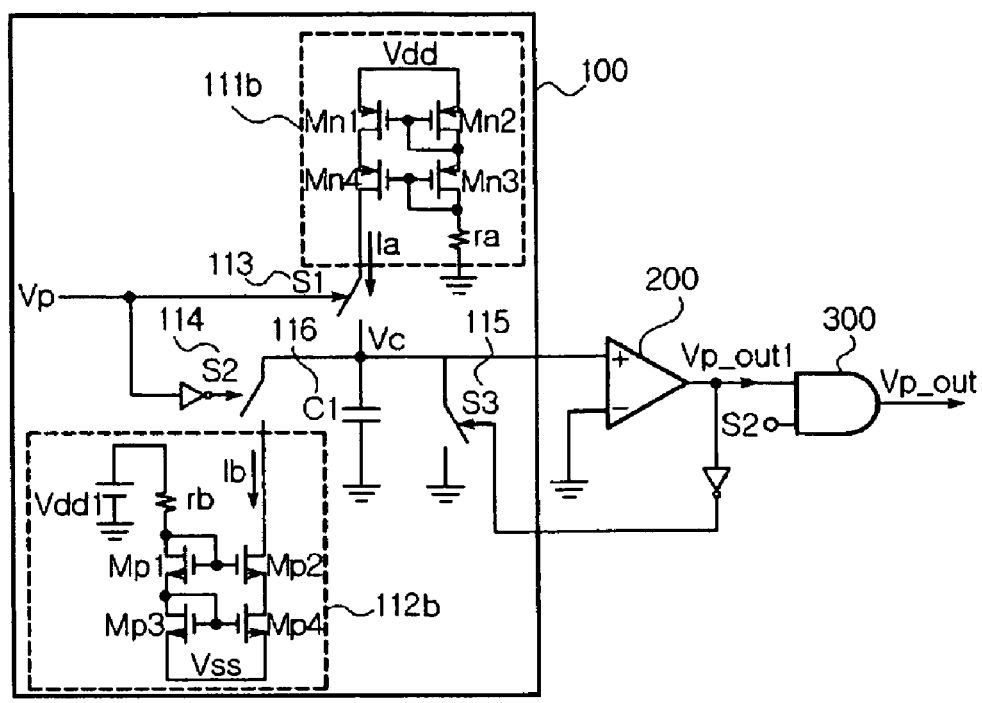
[Fig. 12]

[Fig. 13]
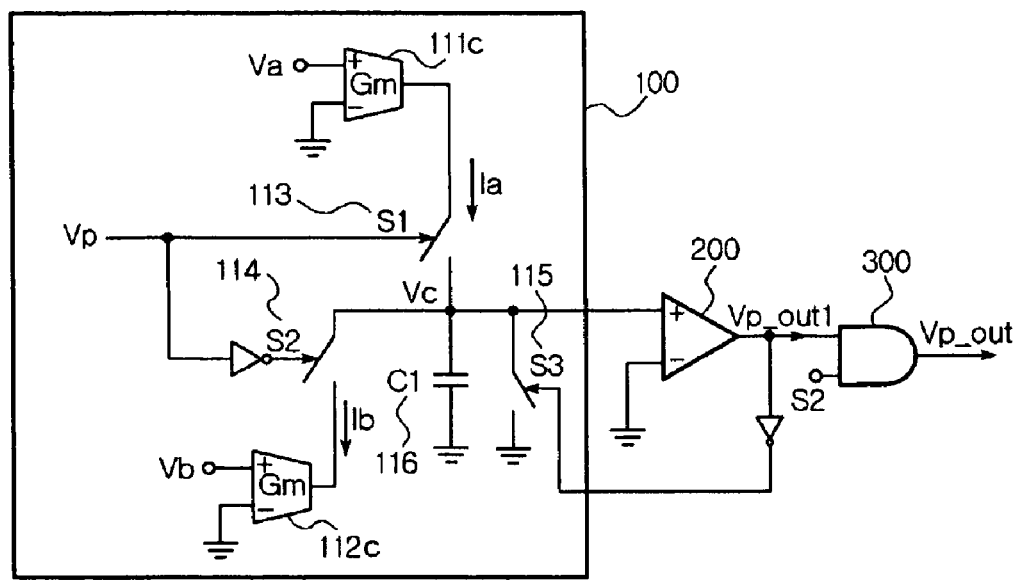

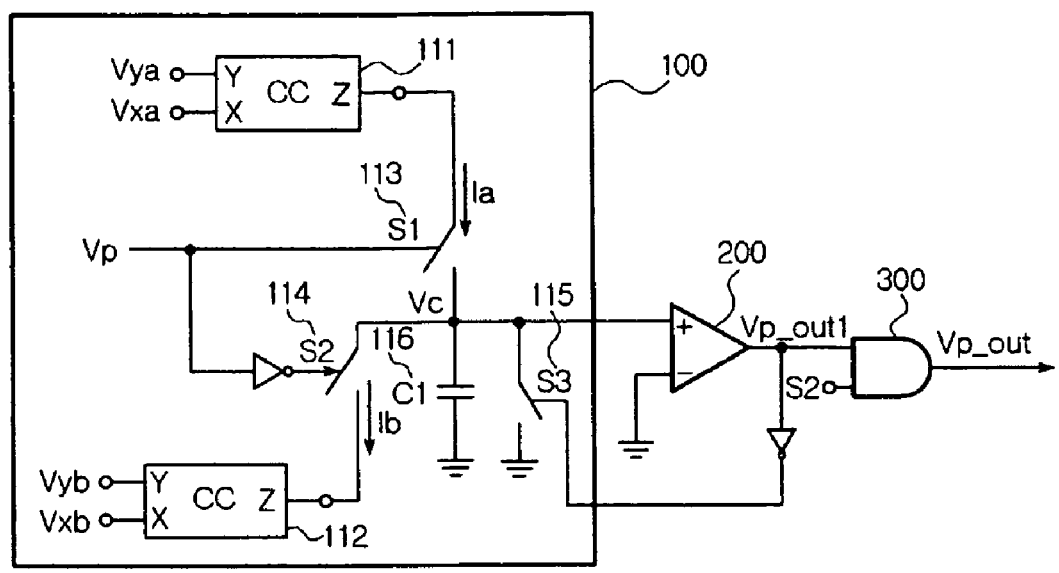
[Fig. 14]

[Fig. 15]
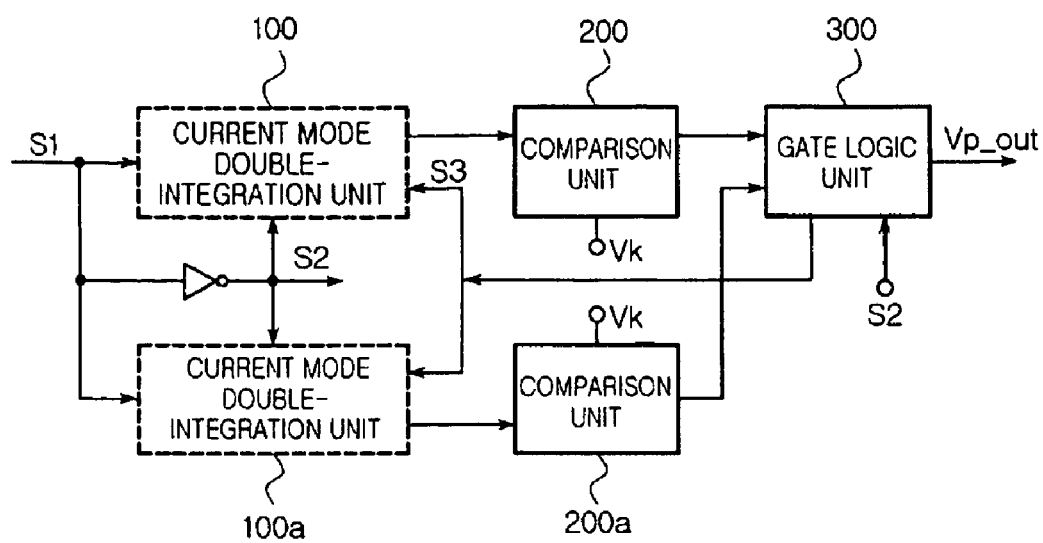

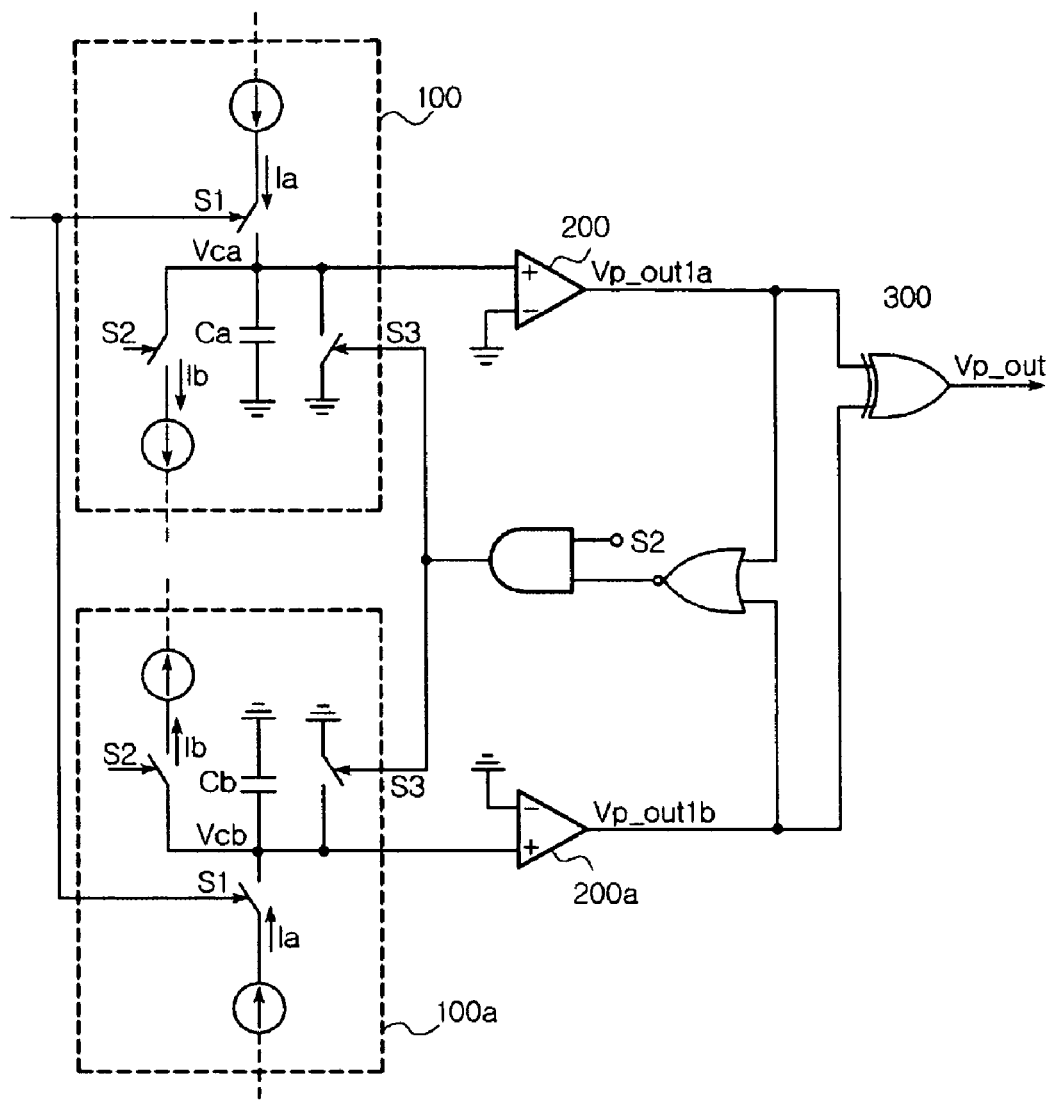
[Fig. 16]

[Fig. 17]
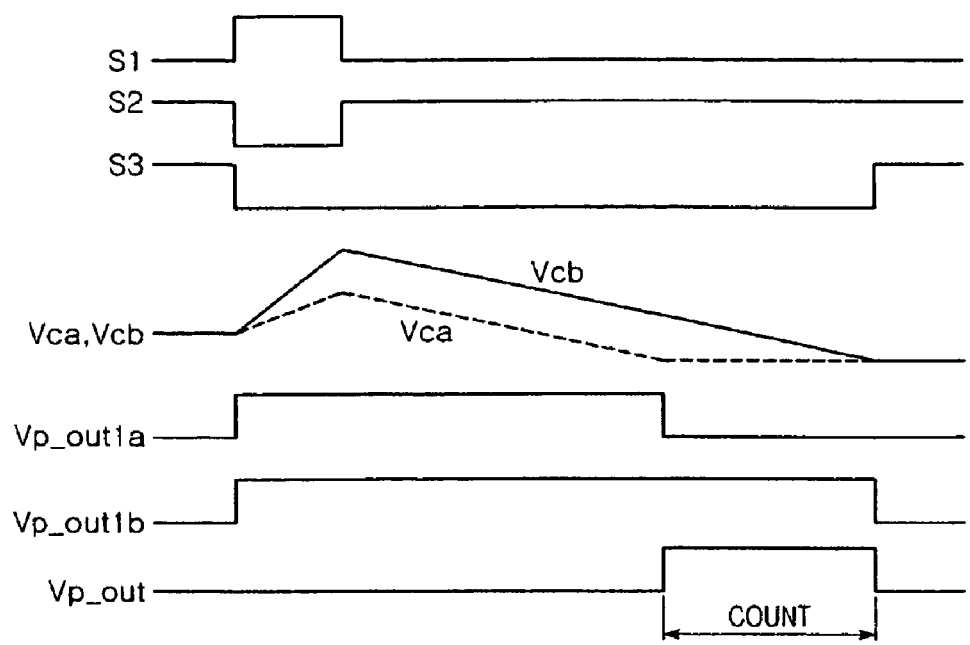

[Fig. 18]
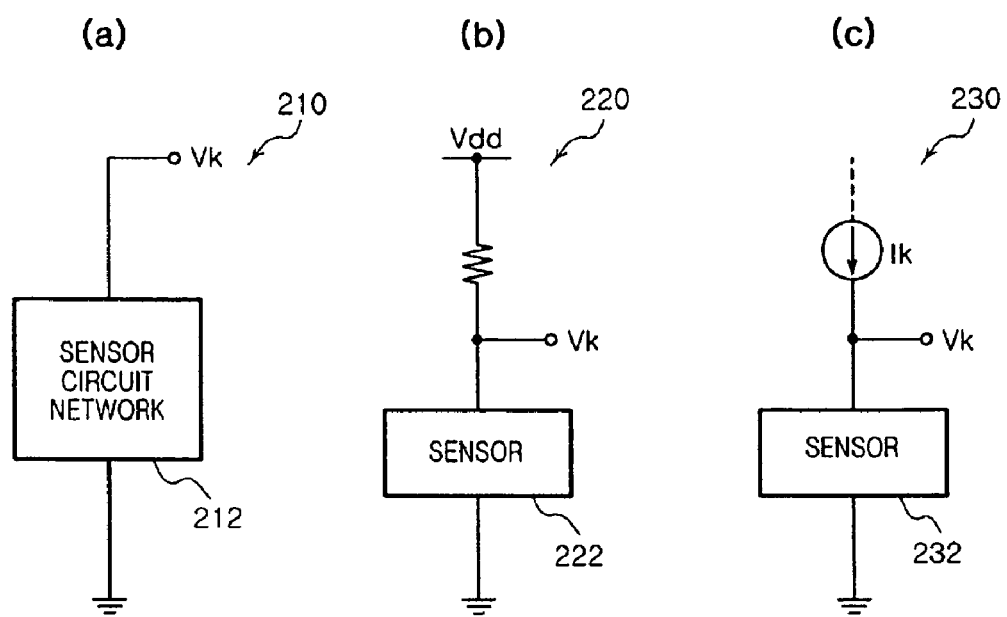

US 7,990,305 B2

CURRENT MODE DOUBLE-INTEGRATION CONVERSION APPARATUS

This is a non-provisional application claiming the benefit of International application number PCT/KR2007/005685 filed Nov. 13, 2007.

TECHNICAL FIELD

The present invention relates to an analog-to-digital (A/D) conversion technology, and more particularly, to a current mode double-integration signal processing apparatus for pulse width amplification and A/D conversion, which is constructed with a double-integration unit by using a current source and has high performance to a sensor and/or a fixed-value device (capacitor, resister, or inductor).

This work party supported by the IT R&D program of MIC/IITA [2006-S-041-01, Development of a common security core module for supporting secure and trusted service in the next generation mobile terminals].

BACKGROUND ART

Conventionally, in most cases where a high-resolution A/D converter is needed, a double-integration A/D converter using an operational amplifier (OP-AMP) is used.

There are some problems in implementation of a semiconductor chip for the double-integration A/D converter. For example, in case of a capacitor device as an integration device used in the double-integration A/D converter, large capacitance is required to integrate the capacitor device into the semiconductor chip.

In addition, the OP-AMP and other devices in the double-integration A/D converter are implemented with very complicated circuits. The double-integration A/D converter has a problem in that the circuits are complicated. In addition, the double-integration A/D converter has a problem in that additional physical circuits for amplifying an analog signal and removing noise are needed for measuring the analog signal which causes a very small change in a sensor.

DISCLOSURE OF INVENTION

Technical Problem

A first aspect of the present invention provides a current mode double-integration conversion apparatus capable of implementing a pulse width amplifier and an A/D converter having a simple structure and an excellent performance for an associated sensor.

A second aspect of the present invention provides a current mode double-integration conversion apparatus capable of implementing a pulse width amplification function and an A/D conversion function by using a current source with a higher sensitivity than an associated sensor of a device having a fixed value.

Technical Solution

According to an aspect of the present invention, there is provided a current mode double-integration conversion apparatus comprising: a current mode double-integration unit which integrates an input current in a predetermined time interval and outputs an integration voltage; a comparison unit which compares the integration voltage output from the current mode double-integration unit with a predetermined comparison voltage $V_k$ and outputs an comparison pulse signal; and a gate logic unit which performs a logic operation by using the comparison pulse signal of the comparison unit and an internal signal and outputs an logic operation pulse signal.

In the above aspect, the current mode double-integration conversion apparatus may further comprise a digital control unit which generates a signal suitable for a predetermined purpose based on the logic operation pulse signal output from the gate logic unit.

In addition, the current mode double-integration unit may comprise: a capacitor which charges and discharges the input current; a first current source which supplies a charging current to the capacitor; a second current source which discharges the charged current of the capacitor; a first switch which controls the charging current supplying of the first current source; a second switch which controls the charged current discharging of the second current source; and a third switch which is connected to a ground between the comparison unit and the capacitor to change the integration voltage to 0 according to an output signal Vp_out of the gate logic unit or the comparison unit.

Advantageous Effects

According to the present invention, a current mode double-integration conversion apparatus can be applied to various sensors, a simple circuit with excellent characteristics can be implemented. In addition, according to the present invention, the current mode double-integration conversion apparatus can be applied to a capacitive sensor or a resistive sensor by using an interface circuit without modification or with simple medication.

BRIEF DESCRIPTION OF THE DRAWINGS

FIG. 1 is a schematic block diagram illustrating a construction of a current mode double-integration conversion apparatus according to an embodiment of the present invention.

FIGS. 2 and 3 are circuit diagrams illustrating examples of the current mode double-integration conversion apparatus according to the embodiment of the present invention illustrated in FIG. 1.

FIGS. 4 to 6 are detailed circuit diagrams illustrating the circuit diagrams FIGS. 2 and 3 according to the present invention.

FIGS. 7 and 8 are waveform views illustrating signals generated in FIG. 4 according to the embodiment of the present invention.

FIGS. 9 and 10 are waveform views illustrating signals generated in FIG. 5 according to the embodiment of the present invention.

FIGS. 11 to 14 are views illustrating application examples of the current mode double-integration conversion apparatus according to the embodiment of the present invention.

FIGS. 15 to 17 are views illustrating examples of conversion apparatuses using two or more current mode double-integration conversion apparatuses suitable for various uses according to the embodiment of the present invention.

FIG. 18 is a circuit diagram illustrating a sensor circuit for generating a comparison voltage $V_k$ according to the embodiment of the present invention.

BEST MODE FOR CARRYING OUT THE INVENTION

Now, exemplary embodiments of the present invention will be described in detail with reference to the accompanying drawings so that the present invention can be easily implemented by the ordinarily skilled in the art. In the accompanying drawings, elements having similar functions and operations are denoted by the same reference numerals. If detailed description of well-known functions or constructions is determined not to clarifying the present invention, the detailed description thereof may be omitted.

In the present invention, a current mode double-integration conversion apparatus capable of being applied to various sensors, having a simple circuit structure and excellent characteristics, being applied to a capacitive sensor or a resistive sensor by using an interface circuit without modification or with simple medication, and being operated in cooperation with a control unit to be used for various applications is proposed.

The current mode double-integration conversion apparatus according to the present invention includes a current mode double-integration unit, a comparison unit which compares an output voltage of the current mode double-integration unit with a comparison voltage, a gate logic which generates a control signal in response to a result of the comparison, and a digital control unit which control an output signal of the gate logic.

Accordingly, the current mode double-integration conversion apparatus can be applied to various sensors. In addition, the current mode double-integration conversion apparatus can be implemented with a simple circuit structure and excellent characteristics. In addition, the current mode double-integration conversion apparatus can be implemented as a capacitive sensor or a resistive sensor by using an interface circuit with no or simple modification. In addition, the current mode double-integration conversion apparatus can be applied to various systems according to uses thereof with an excellent performance. In addition, the current mode double-integration conversion apparatus can be easily implemented on a semiconductor chip as semiconductor technologies are improved.

FIG. 1 is a schematic block diagram illustrating a construction of a current mode double-integration conversion apparatus according to an embodiment of the present invention.

As illustrated in FIG. 1, the current mode double-integration conversion apparatus includes a current mode double-integration unit 100, a comparison unit 200, a gate logic unit 300, and a digital control unit 400.

In the current mode double-integration unit 100, when a first switch is turned on, a current is charged (input) from a first current source to a capacitor, so that a positive integration is performed. When a second switch is turned on, a current is discharged (output) from the capacitor to a second current source, so that a negative integration is performed. In this manner, double integration voltages are formed.

The comparison unit 200 compares an output voltage of the current mode double-integration unit 100 with a comparison voltage $V_k$ and outputs a result of comparison.

The gate logic unit 300 outputs a gate logic voltage signal by using the voltage comparison output signal of the comparison unit 200 and an internal signal of the current mode double-integration conversion apparatus. The output signal of the gate logic unit 300 is a digital signal having an arbitrary time pulse width.

In the embodiment, the gate logic unit 300 is has a very simple control logic structure, and thus, the gate logic unit is sometimes referred as a gate logic. In addition, in the embodiment, the gate logic voltage signal of the gate logic unit 300 can be used as a control signal for controlling an output of the current mode double-integration unit 100.

The digital control unit 400 detects a change in pulse width of the pulse signal generated by the gate logic unit 300 and converts the pulse signal into a digital signal (code) required for various signal processing units.

The digital control unit 400 basically includes a counter. In addition to the counter, the digital control unit 400 may includes various digital components. For example, the digital control unit 400 may be constructed with a complicated digital system including a central processing unit (CPU). Alternatively, the digital control unit 400 may be constructed with a simple display system including a memory device.

The current mode double-integration conversion apparatus according to the present invention is classified into two types, that is, an A/D converter and a pulse width amplifier according to the uses thereof. The current mode double-integration conversion apparatus according to the present invention can be used as an A/D converter or a pulse width converter according to the uses thereof. Therefore, current mode double-integration A/D converter can be applied to various application apparatuses. Accordingly, the current mode double-integration conversion apparatus can be very widely applied to various signal processing technologies with uniqueness thereof.

FIGS. 2 and 3 are circuit diagrams illustrating a detailed construction of the current mode double-integration conversion apparatus according to the present invention.

Referring to FIG. 2, the current mode double-integration conversion apparatus includes the current mode double-integration unit 100, the comparison unit 200 which compares the integration voltage output from the current mode double-integration unit 100 with a predetermined voltage (comparison voltage $V_k$), and the gate logic unit 300 which detects the output voltage Vp_out1 of the comparison unit 200 and outputs the gate logic voltage Vp_out to the digital control unit 400.

The current mode double-integration unit 100 includes two current sources 111 and 112, two switches S1 and S2 (113 and 114), and a capacitor 116.

Referring to FIG. 3, the current mode double-integration conversion apparatus includes the current mode double-integration unit 100, the comparison unit 200 which compares the integration voltage output from the current mode double-integration unit 100 with a predetermined voltage (comparison voltage) $V_k$), and the gate logic unit 300 which detects the output voltage $V_g$_out1 of the comparison unit 200 and outputs the gate logic voltage $V_p$_out to the digital control unit 400.

The current mode double-integration unit 100 includes two current sources 111 and 112, three switches S1, S2, and S3 (113, 114, and 115), and a capacitor 116.

In the embodiment, the current sources of the current mode double-integration unit 100 may be constructed in various types. As a simple example, the current source may be constructed by using a transistor such as a MOS transistor, a BJT transistor, and a BiCMOS transistor. Alternatively, the current source may be constructed by directly or indirectly using a current mirror, a cascade current minor, a Wilson current mirror, a modified Wilson current minor, or other current mirrors constructed with transistors TR2.

The current source may be directly or indirectly used for various amplifiers such as a voltage-current transformer (transconductance device GM), a current convey device (CC), and a current amplifier which generate a current as an output.

The switches S1, S2, and S3 of the current mode double-integration unit 100 are constructed as an analog switch, which can be simply constructed by using a transistor. The switches S1, S2, and S3 are simply constructed with an NMOS transistor or a PMOS transistor. Alternatively, the switches S1, S2, and S3 may be constructed with a CMOS transistor. In addition, the switches S1, S2, and S3 may be constructed with a bipolar transistor.

In the embodiment of the present invention, the comparison unit 200 is constructed with a semiconductor device. Referring to the drawings, the comparison unit 200 is driven by a single source or double sources. In a case where a signal source Vdd is supplied to an apparatus system, the current mode double-integration conversion apparatus illustrated in the drawings is driven by the single source. In a case where double sources Vdd and Vss are supplied to the apparatus system, the current mode double-integration conversion apparatus illustrated in the drawings is driven by the double sources.

In the embodiment of the present invention, the gate logic unit 300 may be constructed with one or more logic gates. The gate logic unit 300 generates an output pulse voltage Vp_out. The pulses are counted by the digital control unit 400, so that a value of signal processed by the current mode double-integration conversion apparatus can be detected.

FIGS. 4 to 6 are detailed circuit diagrams illustrating the circuit diagrams FIGS. 2 and 3 according to the present invention.

As illustrated in FIGS. 4 to 6, the constructions and uses of the current mode double-integration conversion apparatus according the present invention can be mainly classified into three cases.

In the first case of the current mode double-integration conversion apparatus, the capacitor C1 (116) is a capacitive sensor, an external input pulse signal $V_p$ has a constant pulse width, and the current sources 111 and 112 supplies a constant current. In this case, the current mode double-integration conversion apparatus can be used as an A/D converter for measuring a capacitance.

In the second case of the current mode double-integration conversion apparatus, the capacitor C1 116 has a fixed value, an external input pulse signal $V_p$ has a constant pulse width, and the current sources 111 and 112 is varied due to external environment factors. In this case, the current mode double-integration conversion apparatus can be used as an A/D converter for measuring various sensor values for resisting external environment, particularly, measuring resistance.

In the third case of the current mode double-integration conversion apparatus, the capacitor C1 (116) has a fixed value, an external input pulse signal $V_p$ has a variable pulse width, and the current sources 111 and 112 supplies a constant current. In this case, the current mode double-integration conversion apparatus can be used as a pulse amplifier for efficiently detecting the pulse.

All the three cases can be implemented by using one current mode double-integration conversion apparatus. According to which one of the capacitance of the capacitor C1 (116), the currents $I_a$ and $I_b$ of the current sources 111 and 112, and input pulse width of the external input pulse signal $V_p$ are selected as a variable, one of the three cases is specified.

FIG. 4 is a detailed circuit diagram illustrating the circuit diagram FIG. 2 according to the present invention. If the current mode double-integration conversion apparatus is the A/D converter for measuring a capacitance, the external input pulse signal $V_p$ has a constant pulse width.

In the current mode double-integration conversion apparatus illustrated in FIG. 4, it is assumed that the current $I_a$ of the current source 111 is larger than the current $I_b$ of the current source 112, that is, $I_a > I_b$. The current sources 111 and 112 generate constant currents $I_a$ and $I_b$. The operations of the current mode double-integration conversion apparatus are as follows.

It is assumed that the external input pulse signal $V_p$ input to the switches S1 and S2 (113 and 114) is changed from a low level to a high level in a predetermined time interval. The switch S1 (113) is turned on, and the switch S2 (114) is turned off.

At this time, the output signal voltage Vp_out1 is changed from a low level to a high level. From the time when the switch S1 (113) is turned on, the current $I_a$ of the current source 111 is flowed into the capacitor C1 (116), so that a charged voltage, that is, first integration voltage $V_{c+}$ is formed.

The first integration voltage $V_{c+}$ is referred as a plus-integration voltage. When the external input pulse signal $V_p$ is maintained in the high level, the plus-integration voltage continues to increase. The plus-integration voltage and the time interval $T_1$ when the plus-integration voltage increases have a relationship expressed by the following Equation 1.

$$V_{c+} = \frac{I_a}{C_1} T_1 \quad \text{[Equation 1]}$$

Here, $V_{c+}$ denotes the first integration voltage, $I_a$ denotes the current of the current source 111, $C_1$ denotes the capacitance of the capacitor 116, and $T_1$ denotes the pulse width time.

In the embodiment, after a fixed pulse width time $T_1$ elapses, the switch S1 (113) is turned off, and the switch S2 (114) is turned on.

From the time when the switch S2 (114) is turned on, the voltage charged in the plus-integration is discharged.

At this time, the current $I_b$ of the current source 112 is discharged from the capacitor C1 (116) in an arbitrary time interval $T_2$. In other words, the current mode double-integration unit 100 generates a second integration voltage Vc− that is referred to as a minus-integration voltage. The minus-integration voltage continues to decrease. As a result, when the minus-integration voltage is lower than the comparison voltage $V_k$ of the comparison unit 200, the output signal voltage Vp_out1 of the comparison unit 200 is changed from the high level to the low level.

The comparison voltage $V_k$ has a value of 0 to an arbitrary voltage. For example, according to the uses of the current mode double-integration conversion apparatus, the comparison voltage $V_k$ may has a value of 0, 0.1V, or 0.5V. In the embodiment, the minus-integration time interval $T_2$ of the current mode double-integration unit 100 is a variable time expressed by the following Equation 2.

$$T_2 = \frac{V_{c+}}{I_b} C_1, \quad \text{[Equation 2]}$$
$$V_{c+} = \frac{I_a}{C_1} T_1$$

Here, the $T_1$ is a fixed time interval due to the pulse width of the external input pulse signal $V_p$, and the $T_2$ is a variable time interval.

The variable time interval $T_2$ can obtained by using a simple gate logic. As the simplest example of the present invention, the variable time interval $T_2$ can obtained by a signal AND gate. The input of the AND gate is controlled by the output signal Vp_out1 of the comparison unit 200 and an output signal of the switch S2 (114). The variable time interval $T_2$ is an output signal of the AND gate which can be counted by the digital control unit 400, so that a measurement value of the sensor can be expressed by a digital value. The associated waveform views are illustrated in FIG. 7.

FIGS. 7 and 8 are waveform views of the signals in the current mode double-integration conversion apparatus illustrated in FIG. 4 according to the embodiment of the present invention. FIGS. 9 and 10 are waveform views of the signals in the current mode double-integration conversion apparatus illustrated in FIG. 5 according to the embodiment of the present invention.

More specifically, FIG. 7 illustrates waveforms of signals in the first use of the current mode double-integration conversion apparatus where the sensed capacitance of the capacitor C1 (116) is varied and in the second use of the current mode double-integration conversion apparatus where the current is varied due to an external factor.

In the current mode double-integration conversion apparatus according to the embodiment of the present invention, the circuit operational models and the mathematical models of the first use where the current is varied and the second uses where the pulse width of the external input pulse signal $V_p$ is varied are the same as those of the first use. The operational waveforms of the signals in the second use are the same as those of the first use. However, the operational waveforms of the signals in the third use are different from those of the first use. The current mode double-integration conversion apparatuses according to the first and second uses can be used as A/d converters. The current mode double-integration conversion apparatuses according to the third use can be used as a pulse width amplifier. The waveforms of the output signals of the pulse width amplifier are illustrated in FIG. 8.

Alternatively, in the present invention, the minus-integration may be performed by using the switch S2 (114), and after that, the plus-integration may be performed. In this case, the same waveforms of the signals as those of FIGS. 7 and 8 can be obtained.

In the current mode double-integration conversion apparatus illustrated in FIG. 7, the time interval $T_1$ is fixed, and the time interval $T_2$ is varied, so that a desired value can be obtained. On the contrary, in the current mode double-integration conversion apparatus illustrated in FIG. 8, the time intervals $T_1$ and $T_2$ are varied. Therefore, in the relationship between the time intervals $T_1$ and $T_2$, it can be seen that the pulse width is amplified.

In a case where the pulse width of the input pulse signal has a very short time interval, a high resolution apparatus can be effectively implemented by using the aforementioned construction. In other words, since the pulse width is increased, a vary high resolution can be obtained by using a low clock. Therefore, a chip having low power consumption can be efficiently developed.

FIG. 5 is a detailed circuit diagram of the circuit illustrated in FIG. 3. The operations of the circuit illustrated in FIG. 5 are the same as those of FIG. 4.

Referring to FIG. 5, the current mode double-integration conversion apparatus further includes a switch S3 (115) which is connected parallel to the capacitor C1 (116). The switch S3 (115) has a function of setting an initial voltage of the capacitor C1 (116) to 0 before the operation of the switch S1 (113). In the simplest case, the switch S3 (115) may be controlled by an inverted signal of the output signal Vp_out1 of the comparison unit 200.

In a case where the comparison voltage $V_k$ of the comparison unit 200 is not 0, a gate logic is needed to control the switch S3 (116) of FIG. 6 similarly to FIG. 5. If needed, the simplest gate logic for controlling the switch S3 (115) can be constructed by using an AND gate and a NOT gate. More specifically, one of the output signal Vp_out1 of the comparison unit 200 and the output signal Vp_out of the current mode double-integration conversion apparatus is input to the NOT gate. An output signal of the NOT gate and an output signal of the switch S2 (114) is input to the AND gate 320 as illustrated in FIG. 6. The operations of the switch S3 (116) is controlled by an output signal of the AND gate 320. The waveforms of the output signals of the circuits of FIGS. 5 and 6 are illustrated in FIGS. 9 and 10, respectively.

FIGS. 11 to 14 are views illustrating application examples of the current mode double-integration conversion apparatus according to the embodiment of the present invention.

The operations of the double-integration conversion apparatus illustrated in FIGS. 11 to 13 are the same as those of FIGS. 4 to 6.

As illustrated in FIGS. 11 to 13, the applications of the current mode double-integration conversion apparatus can be divided into four applications according to which types of the current source is used.

The current mode double-integration conversion apparatus illustrated in FIG. 11 uses cascade current sources 111*a* and 112 corresponding to the embodiment illustrated in FIG. 4. The current mode double-integration conversion apparatus illustrated in FIG. 12 uses cascade current sources 111*b* and 113 corresponding to the embodiment illustrated in FIG. 5. The current mode double-integration conversion apparatus illustrated in FIG. 13 uses transconductance amplifiers 111*c* and 112*c* corresponding to the embodiment illustrated in FIG. 5. The current mode double-integration conversion apparatus illustrated in FIG. 14 uses current transfer devices (current amplifiers) 111*d* and 112*d* corresponding to the embodiment illustrated in FIG. 5.

FIGS. 15 to 17 are views illustrating examples of conversion apparatuses using two or more current mode double-integration conversion apparatuses suitable for various uses according to the embodiment of the present invention.

The current mode double-integration conversion apparatuses illustrated in FIGS. 15 to 17 can be used for the aforementioned three uses. In addition, measurement of various sensors is performed by using a differential operation. Therefore, nonlinear phenomena associated with temperature, humidity, and the like are negligible.

FIG. 15 illustrates the simplest example of the conversion apparatus constructed with two current mode double-integration conversion apparatuses illustrated in FIG. 1. Therefore, the conversion apparatus is constructed with two current mode double-integration units 100 and 100*a*, two comparison units 200 and 200*a*, and a gate logic unit 300 which performs controlling by using output signals of the comparison units 200 and 200*a*.

FIG. 16 is a detailed circuit diagram of the block diagram of FIG. 15. FIG. 17 is a waveform view of signals in the circuit. In this case, a differential operation is further used, so that more accurate measurement can be obtained according to a construction of gate logic.

In the current mode double-integration conversion apparatus, a differential pulse width is obtained from an EX-OR gate. The switches S3 (115 and 119) can be controlled by output signals of an NOR gate and an AND. The operations of the current mode double-integration conversion apparatus can be expressed by the following Equation 3.

$$V_{ca+} = \frac{I_a}{C_a} T_{1A},$$ [Equation 3]

$$V_{cb+} = \frac{I_a}{C_b} T_{1B}$$

Here, the two equations are associated with a plus-integration voltage. The equations can be expressed with respect to time by the following Equation 4.

$$T_{2A} = \frac{V_{ca+}}{I_b}C_a,$$
$$T_{2B} = \frac{V_{cb+}}{I_b}C_b$$

[Equation 4]

Here, the two equations represent minus-integration time intervals. The gate logic (control unit) suitable for application system can be constructed by using the aforementioned equations. In a case where external unstable environment doe not influence, an accurate measurement can be implemented by using a differential time
ΔT
expressed by the following Equation 5.

$$\Delta T = T_{2B} - T_{2A} = \frac{V_{cb} - V_{ca}}{I_b}(C_b - C_a)$$

[Equation 5]

In the embodiment of the present invention, counting is performed by using a clock corresponding to the differential time
ΔT,
so that a value of a sensor can be measured. As can be understood in Equation 5, the differential time
ΔT
can be adjusted by using currents Cb and Ca. In addition, it can be understood that unnecessary environmental factors which influence to the performance can be removed.

FIG. 18 is a circuit diagram illustrating a sensor circuit for generating a comparison voltage $V_k$ according to the embodiment of the present invention.

The comparison voltage $V_k$ is in a range of 0 to an arbitrary voltage.

A use of the current mode double-integration conversion apparatus other than the aforementioned three uses is described.

In the use, the capacitance of the capacitor 116, the currents of the current sources 111 and 112, and the pulse width of the external input pulse signal $V_p$ are fixed, and the comparison voltage $V_k$ is sued as a sensor signal voltage. The technical and mathematical models are the same as those of the aforementioned three uses. However, since the comparison voltage $V_k$ is used as the sensor signal voltage, a new use of the current mode double-integration conversion apparatus can be derived.

FIG. 18(a) illustrates availability of various sensors for obtaining the comparison voltage $V_k$ in the embodiment. For example, a sensor using a bridge circuit, a sensor using a current source circuit, and a sensor using a voltage division circuit can be implemented.

FIG. 18(b) illustrates a sensor 222 using a voltage division circuit 220 so as to obtain the comparison voltage $V_k$ as the sensor signal. FIG. 18(c) illustrates a sensor 232 using a current source circuit 230 so as to obtain the comparison voltage $V_k$ as the sensor signal.

While the present invention has been shown and described in connection with the exemplary embodiments, it will be apparent to those skilled in the art that modifications and variations can be made without departing from the spirit and scope of the invention as defined by the appended claims.

INDUSTRIAL APPLICABILITY

According to the present invention, a conversion apparatus for pulse width amplification and A/D conversion using a current source mode can be applied to various sensors by using a current mode double-integration A/D converter with a simple circuit structure and excellent circuit characteristics. In addition, according to the present invention, the current mode double-integration conversion apparatus can be applied to a capacitive sensor or a resistive sensor by using an interface circuit without modification or with simple medication.

In addition, according to the present invention, the current mode double-integration conversion apparatus can be applied to various systems according to uses thereof with an excellent performance. In addition, according to the present invention, the current mode double-integration conversion apparatus can be easily implemented on a semiconductor chip as semiconductor technologies are improved.

The invention claimed is:

1. A current mode double-integration conversion apparatus comprising:
    a current mode double-integration unit which integrates an analog input current in a predetermined time interval and outputs an integration voltage;
    a comparison unit which compares the integration voltage output from the current mode double-integration unit with a predetermined comparison voltage $V_k$ and outputs an a comparison pulse signal; and
    a gate logic unit which performs a logic operation by using the comparison pulse signal of the comparison unit and an internal signal and outputs a logic operation pulse signal wherein the gate logic unit includes at least one logic AND gate which the comparison pulse signal output from the comparison unit and an inverted signal of an input pulse signal are input to.

2. The current mode double-integration conversion apparatus of claim 1, further comprising a digital control unit which generates a signal suitable for a pre-determined purpose based on the logic operation pulse signal output from the gate logic unit.

3. The current mode double-integration conversion apparatus of claim 2, wherein the digital control unit counts the logic operation pulse signal and uses a count value for a predetermined application and converts the logic operation pulse signal to a digital signal.

4. The current mode double-integration conversion apparatus of claim 1, wherein the current mode double-integration unit comprises:
    a capacitor which charges and discharges the input current;
    a first current source which supplies a charging current to the capacitor;
    a second current source which discharges the charged current of the capacitor;
    a first switch which controls the charging current supplying of the first current source; and
    a second switch which controls the charged current discharging of the second current source.

5. The current mode double-integration conversion apparatus of claim 4, further comprising a third switch which is connected to a ground between the comparison unit and the capacitor to change the integration voltage to 0 according to an output signal Vp_out of the gate logic unit or the comparison unit.

6. The current mode double-integration conversion apparatus of claim 5, wherein the first to third switches are an analog switch using a transistor.

7. The current mode double-integration conversion apparatus of claim 5, wherein, in a case where the capacitor constitutes a resistive sensor, the capacitor has a fixed capacitance, the external input pulse signal $V_p$ has a constant pulse width, and the currents of the first and second current sources are varied due to an external environmental factor, a value of the resistive sensor is measured.

8. The current mode double-integration conversion apparatus of claim 5, wherein, in a case where the capacitor has a fixed capacitance, the external input pulse signal $V_p$ has a variable pulse width, and the first and second current sources have constant currents, and the current mode double-integration conversion apparatus is used for a pulse width amplifier for sensitively detecting a pulse.

9. The current mode double-integration conversion apparatus of claim 8, wherein the pulse width amplification unit variably amplifies the input pulse width $V_p$.

10. The current mode double-integration conversion apparatus of claim 4, wherein, in a case where the capacitor constitutes a capacitive sensor, an external input pulse signal $V_p$ for controlling the first and second switches has a constant pulse width, and the first and second current sources have constant currents, and a value of the capacitive sensor is measured.

11. The current mode double-integration conversion apparatus of claim 1, wherein the current mode double-integration unit includes at least one of a current mirror, a transconductance device, a current transfer device using a transistor.

12. The current mode double-integration conversion apparatus of claim 1, wherein the comparison unit compares and detects only the output voltage which is integrated by the current mode double-integration unit and outputs a result of detection.

13. The current mode double-integration conversion apparatus of claim 1, wherein the comparison voltage $V_k$ is set to vary in a range of 0 to an arbitrary voltage and used as a sensor signal voltage.

14. The current mode double-integration conversion apparatus of claim 1, wherein the comparison voltage $V_k$ is set to a fixed voltage in a range of 0 to an arbitrary voltage and used as an arbitrary fixed signal voltage.

15. The current mode double-integration conversion apparatus of claim 1, wherein the comparison voltage $V_k$ is acquired from a circuit network which includes at least one of a bridge circuit, a current source circuit, and a voltage division circuit.

16. The current mode double-integration conversion apparatus of claim 1, wherein the current mode double-integration unit and the comparison unit are constructed with at least two differential amplifiers.

17. The current mode double-integration conversion apparatus of claim 16, wherein the gate logic unit includes an EX-OR gate to generates the pulse width signal by controlling the output signals of the two comparison units.

* * * * *